United States Patent
Tu et al.

(10) Patent No.: US 9,929,051 B1
(45) Date of Patent: Mar. 27, 2018

(54) WAFER DICING METHOD

(71) Applicant: CHIPBOND TECHNOLOGY CORPORATION, Hsinchu (TW)

(72) Inventors: Chia-Jung Tu, Hsinchu (TW); Chih-Lung Chen, Taipei (TW); Wen-Hsiang Liao, Taichung (TW); Chung-Hsiang Wei, Hsinchu County (TW); Yung-Chi Liu, New Taipei (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/342,241

(22) Filed: Nov. 3, 2016

(30) Foreign Application Priority Data

Sep. 23, 2016 (TW) .............................. 105130694 A

(51) Int. Cl.
| | | |
|---|---|---|
| H01L 21/00 | (2006.01) |
| H01L 21/78 | (2006.01) |
| H01L 21/30 | (2006.01) |
| H01L 23/544 | (2006.01) |
| H01L 21/304 | (2006.01) |

(52) U.S. Cl.
CPC .......... *H01L 21/78* (2013.01); *H01L 21/3043* (2013.01); *H01L 23/544* (2013.01); *H01L 2223/5446* (2013.01)

(58) Field of Classification Search
CPC ................................ H01L 21/78; H01L 21/00
USPC ................................... 438/458–462; 257/260
See application file for complete search history.

(56) References Cited

U.S. PATENT DOCUMENTS

| 3,735,483 | A | * | 5/1973 | Sheldon | ................. | C25D 13/22 |
| | | | | | | 148/DIG. 51 |
| 5,824,177 | A | * | 10/1998 | Yoshihara | ............... | B29C 43/36 |
| | | | | | | 156/250 |
| 6,165,813 | A | * | 12/2000 | Quinn | ..................... | B41J 2/155 |
| | | | | | | 257/E21.705 |

(Continued)

FOREIGN PATENT DOCUMENTS

| JP | S61-181615 | 8/1986 |
| JP | 2-155611 A | 6/1990 |

(Continued)

OTHER PUBLICATIONS

English translation of Foreign Patent: JP2003209089.*
Taiwanese Office Action dated Mar. 6, 2017 for Taiwanese Patent Application No. 105130694, 6 pages.
Japanese Office Action dated Nov. 6, 2017 for Japanese Patent Application No. 2016-217014, 3 pages.
Korean Office Action dated Nov. 14, 2017 for Korean Patent Application No. 10-2016-0146339, 5 pages.

*Primary Examiner* — Sheikh Maruf
(74) *Attorney, Agent, or Firm* — Jackson IPG PLLC; Demian K. Jackson

(57) ABSTRACT

A wafer dicing method comprises providing a wafer and performing a cutting procedure and a contacting procedure. The wafer includes a plurality of dies and a metal layer, wherein the metal layer is formed on a scribe line which is formed between adjacent dies. A cutter is used to cut the metal layer along the scribe line during the cutting procedure to form a plurality of dies on the wafer, and the metal layer cut by the cutter remains a plurality of metal burrs on the dies. A brush is used to contact with the metal burrs along the cutting slot during the contracting procedure to prevent each of the metal burrs from protruding from a surface of each of the dies.

3 Claims, 9 Drawing Sheets

(56) References Cited

U.S. PATENT DOCUMENTS

| | | | |
|---|---|---|---|
| 6,214,639 B1* | 4/2001 | Emori | H01L 21/3043 257/E21.238 |
| 6,974,726 B2* | 12/2005 | Dani | H01L 21/78 257/620 |
| 2002/0096743 A1* | 7/2002 | Spooner | B81C 1/00888 257/620 |
| 2003/0129810 A1* | 7/2003 | Barth | H01L 31/1828 438/462 |
| 2004/0192024 A1* | 9/2004 | Ito | H01L 21/78 438/623 |
| 2006/0038291 A1* | 2/2006 | Chung | H01L 23/3114 257/738 |
| 2009/0181520 A1* | 7/2009 | Li | H01L 21/78 438/462 |
| 2011/0198753 A1* | 8/2011 | Holland | H01L 23/3114 257/738 |
| 2012/0049379 A1* | 3/2012 | Richter | H01L 29/0657 257/773 |
| 2012/0186078 A1* | 7/2012 | Shau | H01L 21/76898 29/830 |
| 2014/0264859 A1* | 9/2014 | Chen | H01L 21/78 257/738 |
| 2015/0155248 A1* | 6/2015 | Lin | H01L 21/76879 257/737 |
| 2015/0232332 A1* | 8/2015 | Magnus | B81C 1/00896 438/464 |
| 2017/0084526 A1* | 3/2017 | Lin | H01L 21/76879 |

FOREIGN PATENT DOCUMENTS

| | | |
|---|---|---|
| JP | 2001-326193 A | 11/2001 |
| JP | 2003-133256 A | 5/2003 |
| JP | 2003-209089 | 7/2003 |
| JP | 2003209089 A * | 7/2003 |
| JP | 2005-142399 A | 6/2005 |
| JP | 2007-188974 | 7/2007 |
| JP | 2015-220240 A | 12/2015 |
| JP | 2016-134433 A | 7/2016 |
| KR | 10-2009-0024408 A | 3/2009 |
| KR | 10-2016-0010310 A | 1/2016 |
| TW | 200949925 | 12/2009 |
| TW | 201608656 | 3/2016 |

* cited by examiner

US 9,929,051 B1

WAFER DICING METHOD

FIELD OF THE INVENTION

This invention generally relates to a wafer dicing method, more particularly to a wafer dicing method able to prevent metal burrs from protruding on die surface.

BACKGROUND OF THE INVENTION

With reference to FIG. 11, a wafer 400 is firstly fixed on a carrier 600 by a tape 500 in conventional wafer dicing method, and then using a cutter (not shown) to cut the wafer 400 to form a plurality of chips 410. However, a plurality of metal burrs 411 will be formed protruded from the surface of the chip 410 during cutting. With reference to FIG. 12, when the chip 410 interconnects with a plurality of bumps 710 on a substrate 700 which is made of flexible material, glass or other materials by flip-chip technology, the metal burrs 411 protruded from the surface of the chip 410 will contact with the substrate 700 to cause leakage or short circuit of semiconductor structure, or affect electric signal input or output.

SUMMARY

The primary object of the present invention is to use a brush to contact with metal burrs formed result from cutting metal layer to prevent the metal burrs from protruding on die surface.

A wafer dicing method of the present invention comprises providing a wafer including a plurality of dies and a metal layer, wherein each of the dies includes a surface and there is a scribe line formed between adjacent dies, and wherein the metal layer is formed on the scribe line; and performing a cutting procedure and a contacting procedure, wherein a cutter is used to cut the metal layer along the scribe line during the cutting procedure to form a plurality of cutting slots on the wafer, and the metal layer cut by the cutter remains a plurality of metal burrs on the dies, and wherein a contacting portion of a brush is used to contact with each of the metal burrs along the cutting slot during the contacting procedure to prevent each of the metal burrs from protruding from the surface of each of the dies.

The present invention uses the brush to contact with the metal burrs during the contacting procedure for preventing the metal burrs formed during the cutting procedure from protruding on the surface of the die. The purpose of preventing the metal burrs from protruding on the die surface is to prevent the metal burrs from contacting with other components during follow-up package process to cause leakage/short circuit or affect electric signal transmission, and also prevent the metal burrs from damaging other components during follow-up package process.

DETAILED DESCRIPTION OF THE INVENTION

Figure 1:
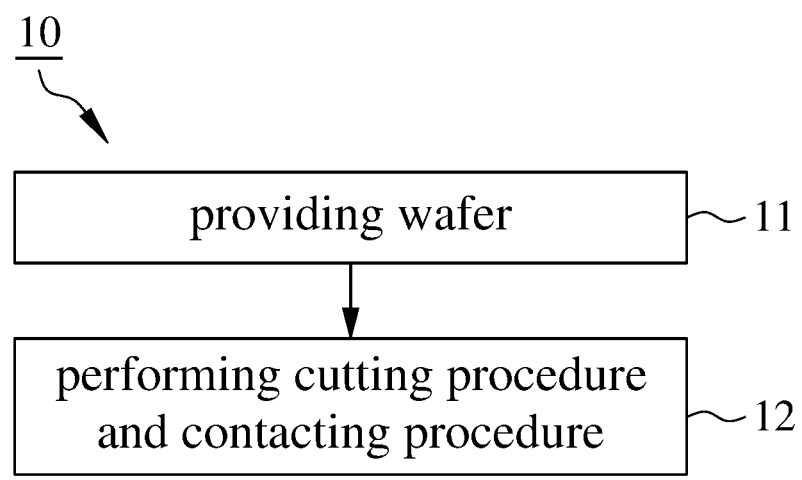
FIG. 1 is a flow chart illustrating a wafer dicing method in accordance with a first embodiment of the present invention.

With reference to FIG. 1, a wafer dicing method 10 in accordance with a first embodiment of the present invention includes step 11 of providing wafer and step 12 of performing cutting procedure and contacting procedure.

Figure 2:
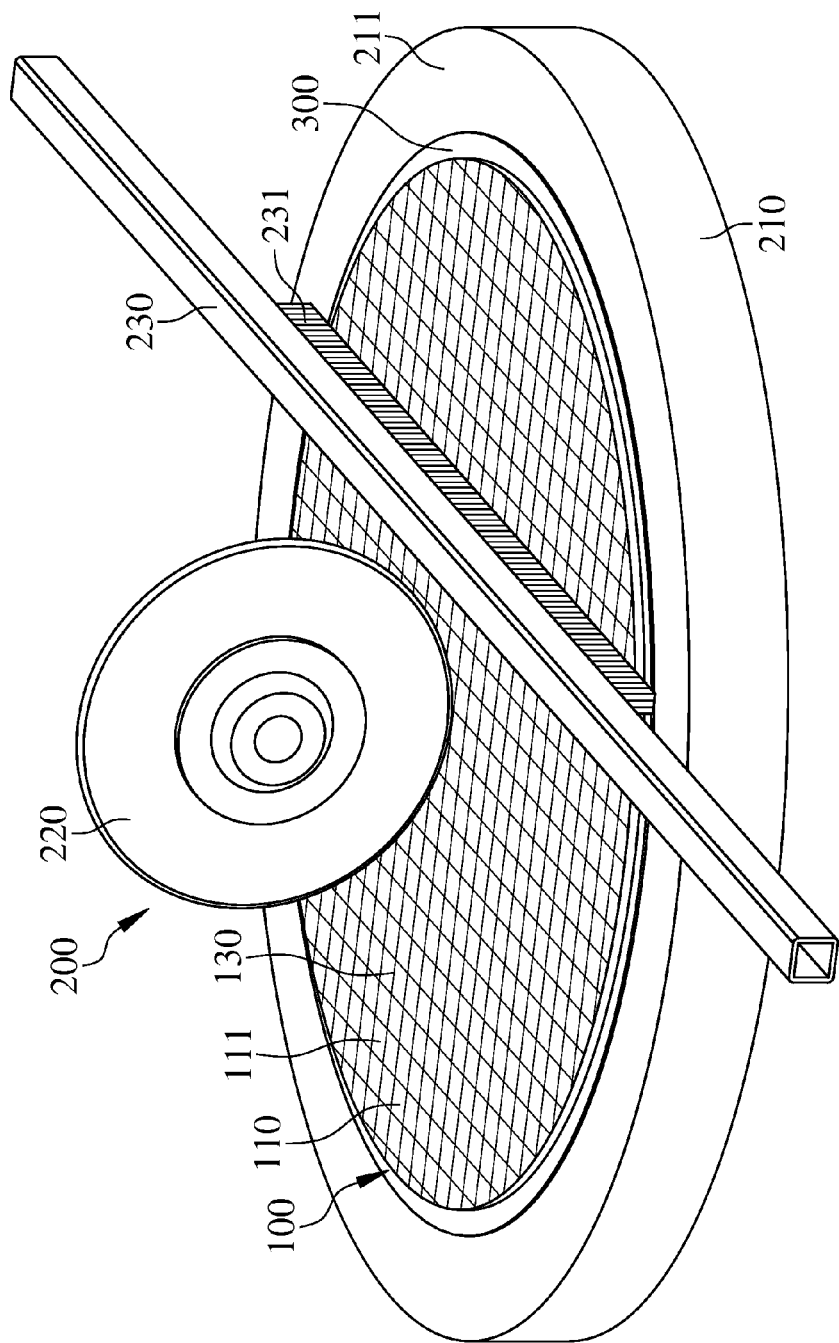
FIG. 2 is a perspective diagram illustrating a wafer and a wafer dicing device in accordance with the first embodiment of the present invention.
Figure 3:
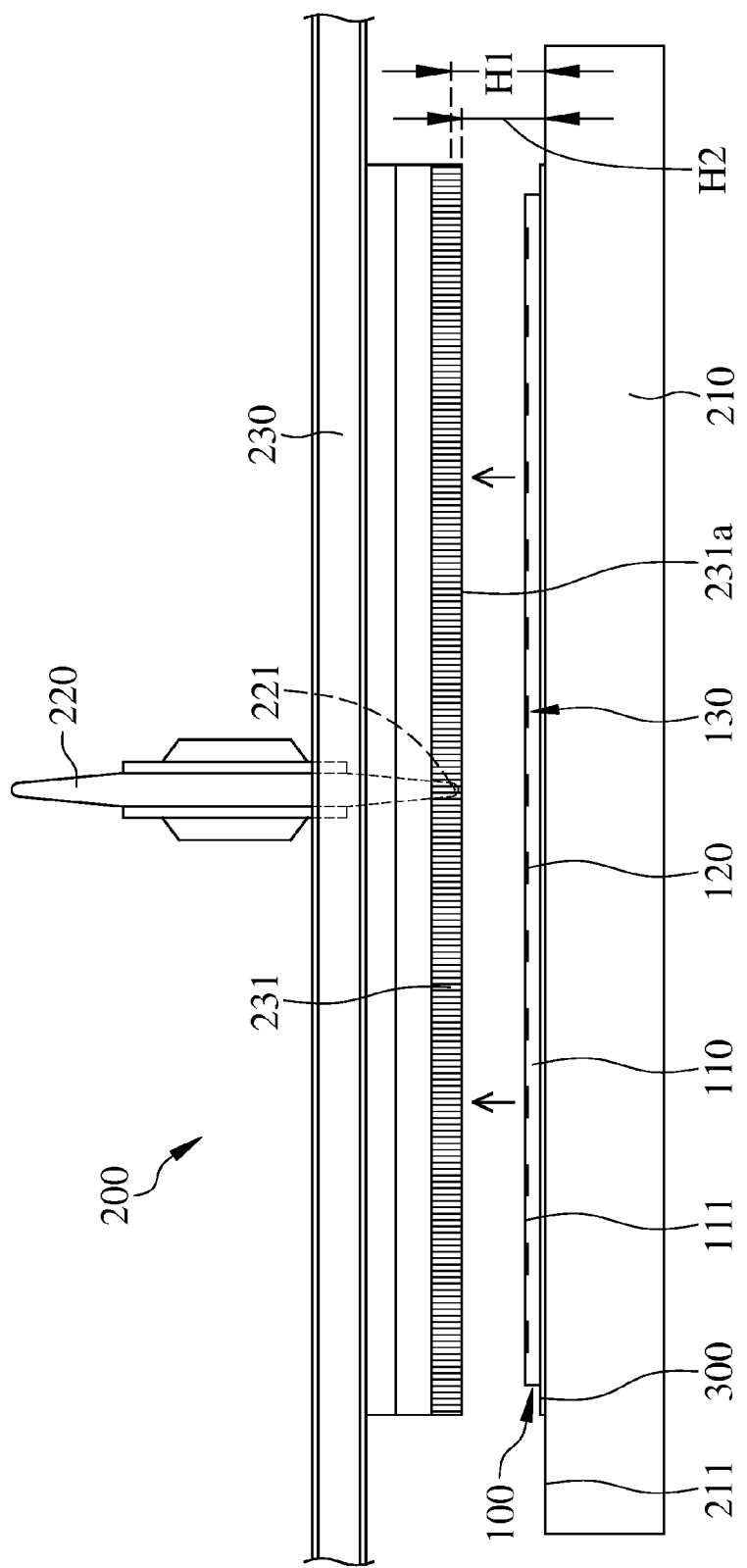
FIG. 3 is a lateral view diagram illustrating the wafer and the wafer dicing device in accordance with the first embodiment of the present invention.

With reference to FIGS. 1, 2 and 3, a wafer 100 is provided in step 11, preferably, the wafer 100 is made of silicon (Si) or group III-V compound semiconductor materials (e.g. GaAs). The wafer 100 includes a plurality of dies 110 arranged in array and a metal layer 120, wherein each of the dies 110 includes a surface 111 which can be the active or inactive surface of the die 110. There is a scribe line 130 formed between adjacent dies 110, and the metal layer 120 is formed on the scribe line 130, wherein the metal layer 120 can electrically connect to the dies 110 for electric test, or the metal layer 120 can be used for cutter aligning in cutting procedure.

With reference to FIGS. 2 and 3, the wafer 100 is cut by a wafer dicing device 200 in the present invention, wherein the wafer dicing device 200 includes a carrier 210, a cutter 220 and a brush 230. The cutter 220 and the brush 230 are located above the carrier 210 and faced toward the surface 111 of each of the dies 110. The wafer 100 is placed on a bearing surface 211 of the carrier 210, and the carrier 210 is used to carry the wafer 100 for movement relative to the cutter 220 and the brush 230 in this embodiment, wherein the movement includes horizontal and vertical movement. In other embodiment, the cutter 220 and the brush 230 can be moved relative to the wafer 100, wherein the movement also includes horizontal and vertical movement. Preferably, the cutter 220 is a cutting wheel, and a contacting portion 231 of the brush 230 is made of flexible material so that the wafer 100 will not be damaged. The contacting portion 231 of the brush 230 can be selected from artificial filament, animal filament or plant filament. In this embodiment, the contacting portion 231 of the brush 230 is DuPont 612 nylon filament.

With reference to FIGS. 2 and 3, there is a fixing tape 300 between the wafer 100 and the carrier 210, wherein the fixing tape 300 is used to fix the wafer 100 for preventing the wafer 100 from moving during cutting.

With reference to FIG. 3, the cutter 220 includes a terminal 221, and the contacting portion 231 of the brush 230 includes a contacting end 231a, wherein the terminal 221 of the cutter 220 and the contacting end 231a of the contacting portion 231 both face toward the bearing surface 211 of the carrier 210. A first height H1 is defined between the terminal 221 of the cutter 220 and the bearing surface 211, and a second height H2 is defined between the contacting end 231a of the contacting portion 231 and the bearing surface 211, wherein the first height H1 is equal to or higher than the second height H2 before step 12 of performing cutting procedure and contacting procedure so that the contacting portion 231 of the brush 230 cannot contact with the wafer 100 is preventable when the carrier 210 is moved upwardly to make the cutter 220 contacting with the wafer 100. In this embodiment, the first height H1 is higher than the second height H2.

Figure 4:
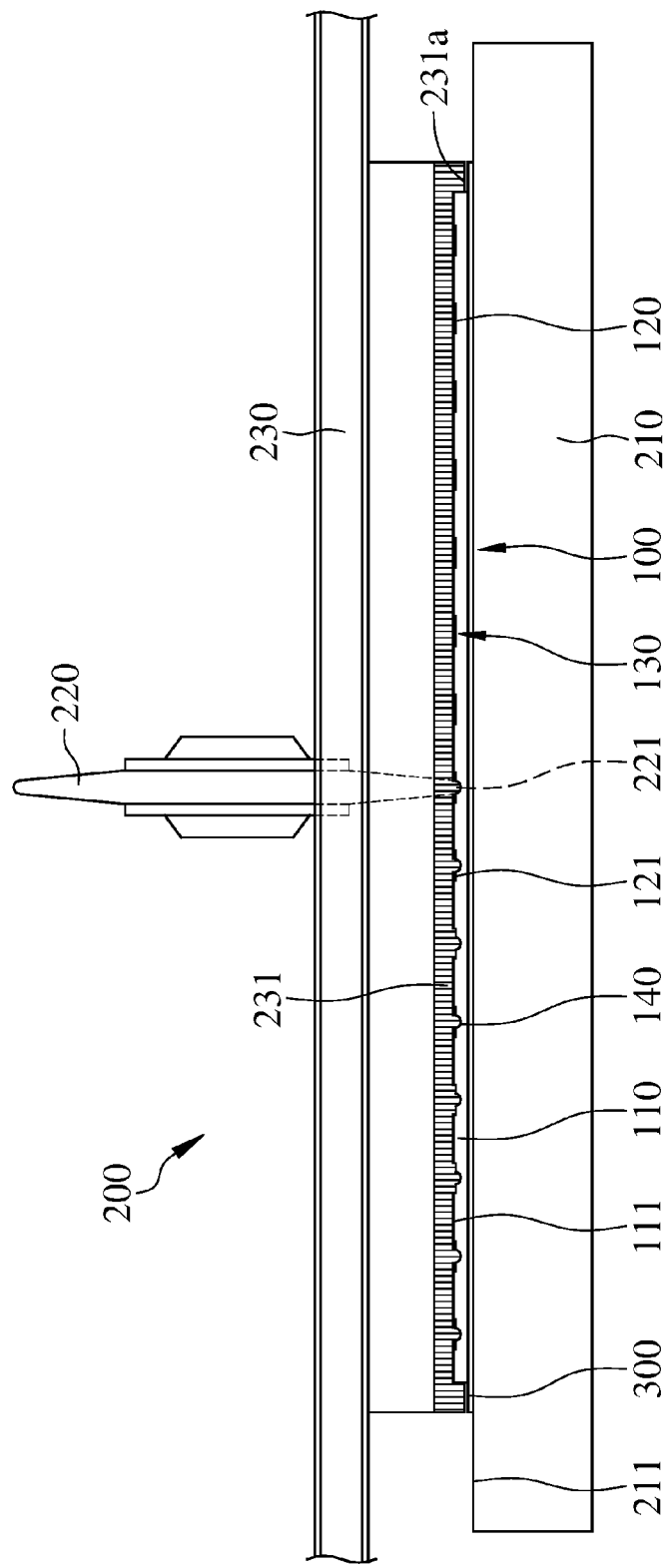
FIG. 4 is a lateral view diagram illustrating the wafer and the wafer dicing device in accordance with the first embodiment of the present invention.
Figure 5:
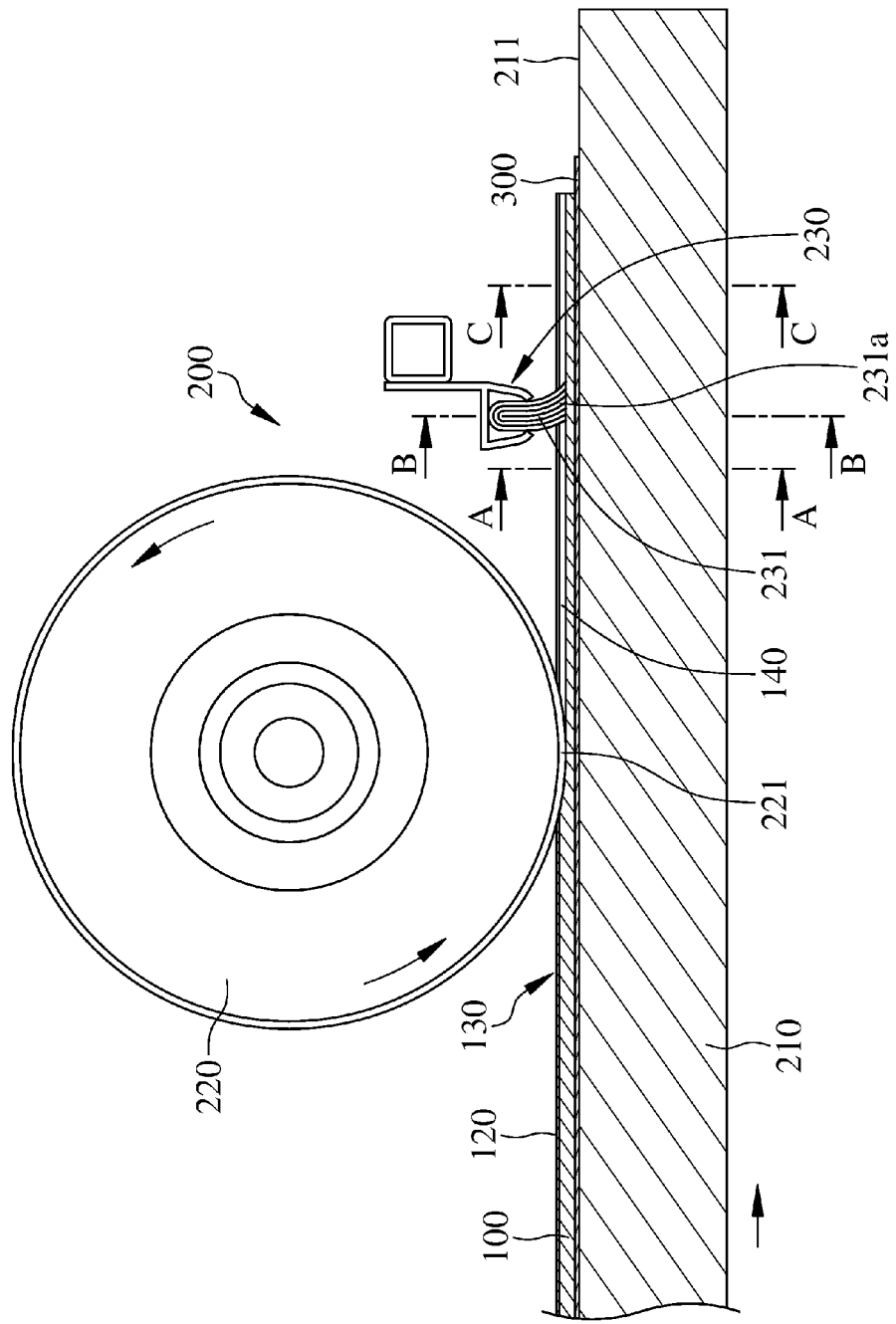
FIG. 5 is a lateral view diagram illustrating the wafer and the wafer dicing device in accordance with the first embodiment of the present invention.

With reference to FIGS. 1, 4 and 5, a cutting procedure and a contacting procedure are performed in step 12. The cutter 220 is used to cut the metal layer 120 along the scribe line 130 to form a plurality of cutting slots 140 on the wafer 110, wherein the dies 110 located at both sides of the cutting slot 140 are electrically disconnected with each other. With reference to FIG. 5, the wafer 100 is moved upwardly by the carrier 210 to contact with the cutter 220 in this embodiment, and then the wafer 100 is horizontally moved relative to the cutter 220 by the carrier 210 to cut the metal layer 120 along the scribe line 130 for forming the cutting slot 140. In this embodiment, the contacting portion 231 of the brush 230 following the cutter 220 contacts with the surface 111 of the die 110 and at least one cutting slot 140 when the cutter 220 cuts the metal layer 120 along the scribe line 130.

Figure 6:
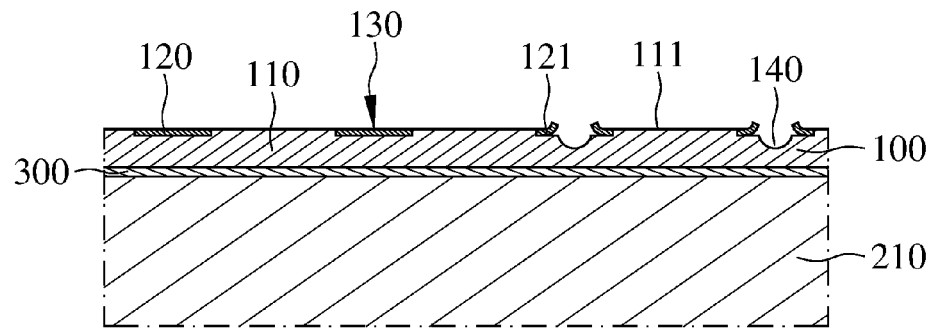
FIG. 6 is a cross-sectional view diagram along A-A line in FIG. 5.

With reference to FIGS. 5 and 6, FIG. 6 is a cross-sectional view diagram along A-A line in FIG. 5. The metal layer 120 will remain a plurality of metal burrs 121 on the dies 110 when the cutter 220 cuts the metal layer 120 along the scribe line 130, and the metal burrs 121 will protrude from the surface 111 of each of the dies 110 because of cutting stress.

Figure 7:
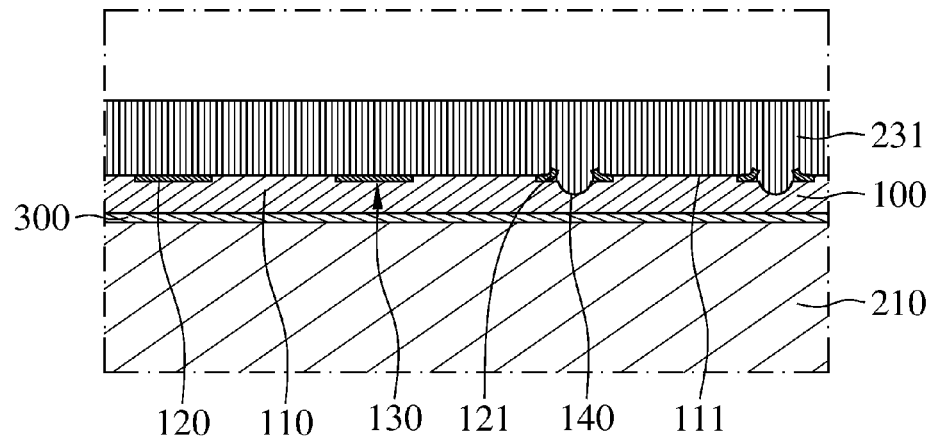
FIG. 7 is a cross-sectional view diagram along B-B line in FIG. 5.

With reference to FIGS. 5 and 7, FIG. 7 is a cross-sectional view diagram along B-B line in FIG. 5. In the contacting procedure, the contacting portion 231 of the brush 230 can touch the surface 111 of each of the dies 110 and the cutting slot 140 along the cutting slot 140, and contact with each of the metal burrs 121, wherein deformation of the contacting portion 231 will occur during the contacting procedure because the contacting portion 231 is made of flexible material.

Figure 8:
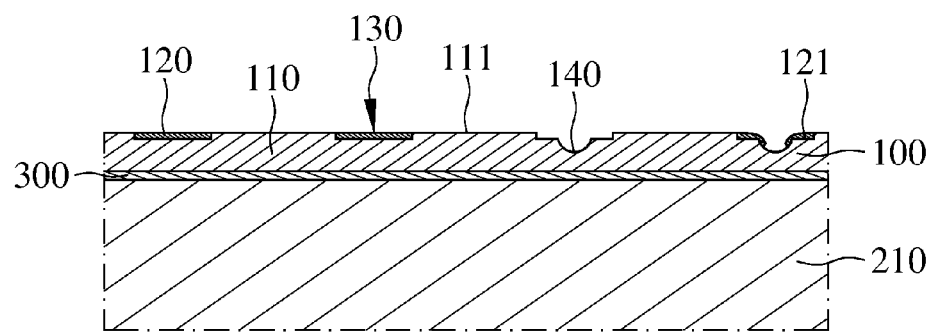
FIG. 8 is a cross-sectional view diagram along C-C line in FIG. 5.

With reference to FIGS. 5 and 8, FIG. 8 is a cross-sectional view diagram along C-C line in FIG. 5. The contacting procedure can prevent the metal burrs 121 from protruding on the surface 111 of each of the dies 110. Preferably, each of the metal burrs 121 will be divided from the dies 110 or bent downwardly toward the cutting slot 140 by horizontal push force or vertical press force from the contacting portion 231 of the brush 230, so the problem that the metal burrs 121 protrude from the surface 111 of each of the dies 110 can be effectively solved. Therefore, the contacting procedure can prevent the metal burrs 121 from electrically connecting with other elements in the follow-up package processes to cause leakage or short circuit, and can prevent the metal burrs 121 from affecting electric signal input or output, or damaging other elements to affect semiconductor efficacy.

The cutting procedure and the contacting procedure are performed simultaneously in this embodiment, so the wafer 100 can be cleaned by air or water curtain to remove wafer fragment formed during the cutting procedure and the metal burrs 121 divided during the contacting procedure for preventing the wafer fragment or the metal burrs 121 from remaining on the wafer 100.

With reference to FIG. 5, in this embodiment, the contacting portion 231 of the brush 230 is placed behind the cutter 220 along with the cutting direction of the cutter 220, and the cutter 220 and the contacting portion 231 of the brush 230 are located on the same scribe line 130. Owing to the cutting procedure and the contacting procedure are performed simultaneously, the contacting portion 231 of the brush 230 can immediately contact with the metal burrs 121 along the cutting slot 140 formed newly to divide the metal burrs 121 from the dies 110 or bend the metal burrs 121 downwardly toward the cutting slot 140 when the cutter 220 cuts the metal layer 120 along the scribe line 130 to form the cutting slot 140, to prevent the metal burrs 121 from protruding from the surface 111 of the die 110.

In other embodiment, the contacting procedure can be performed after completing the cutting procedure. That means the contacting portion 231 of the brush 230 contacts with the metal burrs 121 along each of the cutting slots 140 to divide the metal burrs 121 from the die 110 or bend the metal burrs 121 downwardly toward the cutting slot 140 after the cutter 220 cuts the wafer 100 to make all the dies 110 electrically disconnecting with each other.

Figure 9:
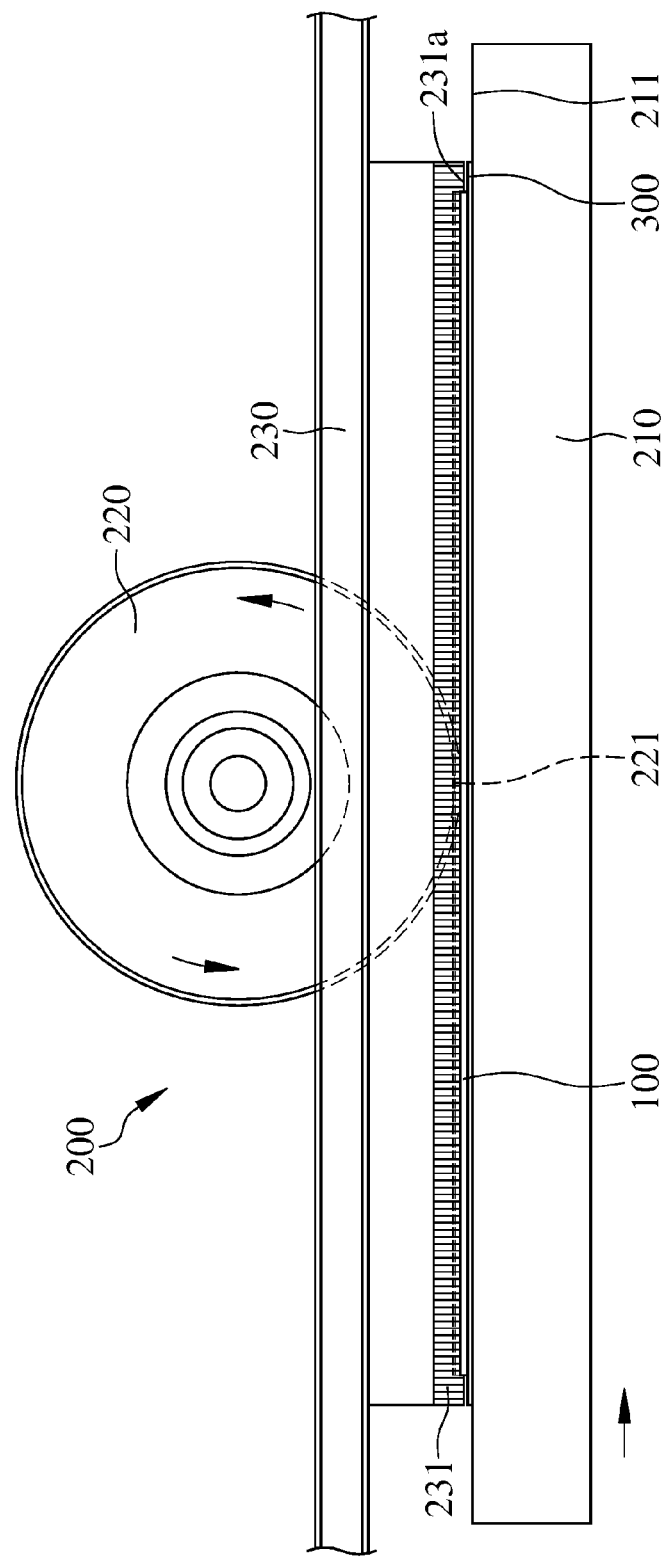
FIG. 9 is a lateral view diagram illustrating a wafer and a wafer dicing device in accordance with a second embodiment of the present invention.
Figure 10:
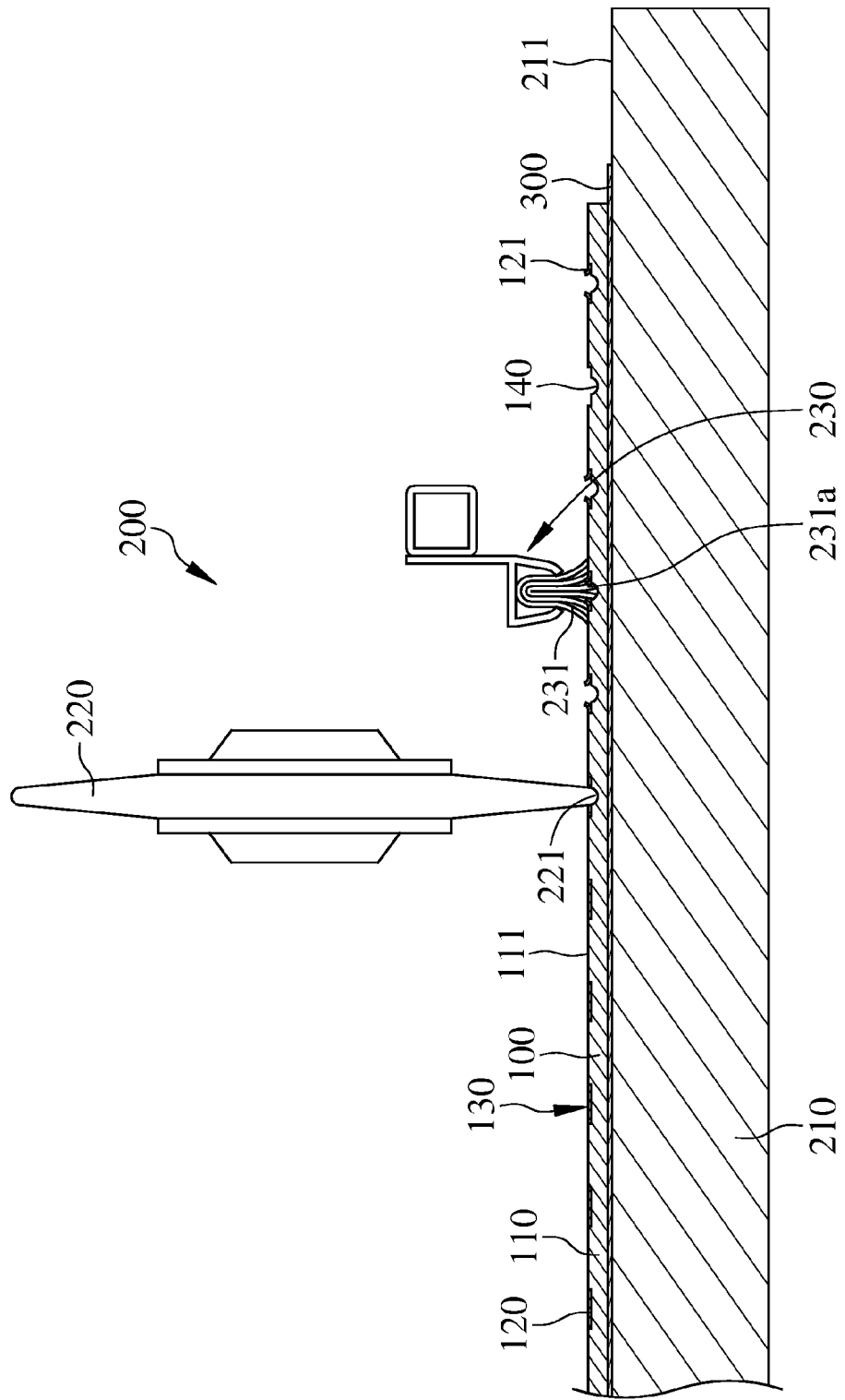
FIG. 10 is a lateral view diagram illustrating the wafer and the wafer dicing device in accordance with the second embodiment of the present invention.
Figure 11:
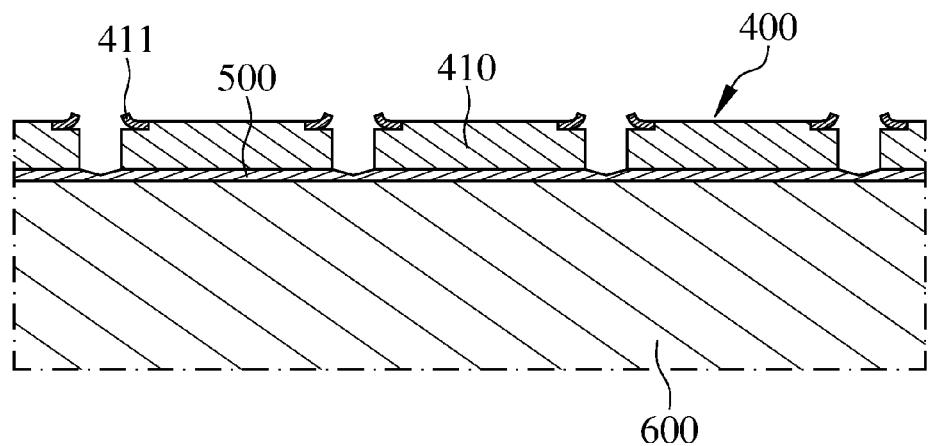
FIG. 11 is a diagram illustrating a wafer after cutting.
Figure 12:
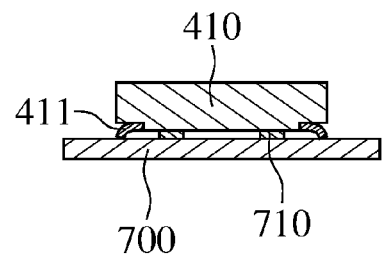
FIG. 12 is a diagram illustrating a chip after flip-chip interconnection.

Second embodiment of the present invention is illustrated in FIGS. 9 and 10, the difference between the second embodiment and the first embodiment is the contacting portion 231 of the brush 230 is placed on the side of the cutter 220 along with the cutting direction of the cutter 220, and the cutter 220 and the contacting portion 231 of the brush 230 are located on the different scribe lines 130. Owing to the cutting procedure and the contacting procedure are performed simultaneously, the brush 230 located on the side of the cutter 220 can contact with the metal burrs 121 along the cutting slot 140 formed previously to divide the metal burrs 121 from the die 110 or bend the metal burrs 121 downwardly toward the cutting slot 140 when the cutter 220 cuts the wafer 100 to form new cutting slot 140. With reference to FIG. 10, the contacting portion 231 of the brush 230 is separated from the cutter 220 by at least one scribe line 130 preferably to prevent interference between the contacting portion 231 of the brush 230 and the cutter 220.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A wafer dicing method comprising:
   providing a wafer including a plurality of dies and a metal layer, layer, wherein each of the dies includes a surface and there is a scribe line formed between adjacent dies, and wherein the metal layer is formed on the scribe line;
   placing the wafer on a bearing surface of a carrier; and
   performing a cutting procedure and a contacting procedure simultaneously, wherein a cutter is used to cut the metal layer along the scribe line during the cutting procedure to form a plurality of cutting slots on the wafer such that a plurality of metal burrs remain on the cutting slots of the dies, and using a contacting portion of a brush to contact with each of the metal burrs along the cutting slot during the contacting procedure to prevent each of the metal burrs from protruding from the surface of each of the dies wherein, during the simultaneous cutting and contacting procedures, the contacting portion of the brush is arranged behind the cutter along a cutting direction of the cutter and the cutter and the contacting portion are located on the same scribe line and wherein, before performing the simultaneous cutting and contacting procedures, a first height exists between a terminal of the cutter and the bearing surface of the carrier and a second height exists between a contacting portion of the brush and the bearing surface of the carrier and wherein the first height is equal to or higher than the second height.

2. The wafer dicing method in accordance with claim 1, wherein each of the metal burrs is separated from the die or bent downwardly toward the cutting slot when the contacting portion of the brush contacts with each of the metal burrs.

3. The wafer dicing method in accordance with claim 1, wherein the contacting portion of the brush is made of flexible material, and deformation of the contacting portion occurs during the contacting procedure.

\* \* \* \* \*